US008241707B2

(12) United States Patent
Fu et al.

(10) Patent No.: US 8,241,707 B2
(45) Date of Patent: *Aug. 14, 2012

(54) SILSESQUIOXANE RESINS

(75) Inventors: Peng-Fei Fu, Midland, MI (US); Eric Scott Moyer, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 54 days.

This patent is subject to a terminal disclaimer.

(21) Appl. No.: 12/919,052

(22) PCT Filed: Feb. 3, 2009

(86) PCT No.: PCT/US2009/032906
§ 371 (c)(1),
(2), (4) Date: Aug. 24, 2010

(87) PCT Pub. No.: WO2009/111121
PCT Pub. Date: Sep. 11, 2009

(65) Prior Publication Data
US 2011/0003480 A1 Jan. 6, 2011

Related U.S. Application Data

(60) Provisional application No. 61/033,832, filed on Mar. 5, 2008.

(51) Int. Cl.
*B32B 9/04* (2006.01)
*G03F 7/075* (2006.01)
(52) U.S. Cl. .............. 427/387; 528/30; 528/31; 528/43; 430/270.1
(58) Field of Classification Search .................. None
See application file for complete search history.

(56) References Cited

U.S. PATENT DOCUMENTS

| | | | |
|---|---|---|---|
| 4,587,138 A | 5/1986 | Yau et al. | |
| 5,010,159 A | 4/1991 | Bank et al. | |
| 5,100,503 A | 3/1992 | Allman et al. | |
| 5,210,168 A | 5/1993 | Bergstrom et al. | |
| 5,412,053 A | 5/1995 | Lichtenhan et al. | |
| 5,422,223 A | 6/1995 | Sachdev et al. | |
| 5,441,765 A | 8/1995 | Ballance et al. | |
| 5,484,867 A | 1/1996 | Lichtenhan et al. | |
| 5,589,562 A | 12/1996 | Lichtenhan et al. | |
| 5,691,396 A | 11/1997 | Takemura et al. | |
| 5,708,099 A | 1/1998 | Kushibiki et al. | |
| 5,762,697 A | 6/1998 | Sakamoto et al. | |
| 5,891,529 A | 4/1999 | Harkness et al. | |
| 6,057,239 A | 5/2000 | Wang et al. | |
| 6,087,064 A | 7/2000 | Lin et al. | |
| 6,143,855 A | 11/2000 | Hacker et al. | |
| 6,156,640 A | 12/2000 | Tsai et al. | |
| 6,177,143 B1 | 1/2001 | Treadwell et al. | |
| 6,268,457 B1 | 7/2001 | Kennedy et al. | |
| 6,281,285 B1 | 8/2001 | Becker et al. | |
| 6,329,118 B1 | 12/2001 | Hussein et al. | |
| 6,340,734 B1 | 1/2002 | Lin et al. | |
| 6,344,284 B1 | 2/2002 | Chou | |
| 6,359,096 B1 | 3/2002 | Zhong et al. | |
| 6,365,765 B1 | 4/2002 | Baldwin et al. | |
| 6,368,400 B1 | 4/2002 | Baldwin et al. | |
| 6,395,397 B2 | 5/2002 | Hong et al. | |
| 6,420,084 B1 | 7/2002 | Angelopoulos et al. | |
| 6,420,088 B1 | 7/2002 | Angelopoulos et al. | |
| 6,424,039 B2 | 7/2002 | Wang et al. | |
| 6,461,955 B1 | 10/2002 | Tsu et al. | |
| 6,503,692 B2 | 1/2003 | Angelopoulos et al. | |
| 6,506,497 B1 | 1/2003 | Kennedy et al. | |
| 6,515,073 B2 | 2/2003 | Sakamoto et al. | |
| 6,576,681 B2 | 6/2003 | Zampini et al. | |
| 6,589,711 B1 | 7/2003 | Subramanian et al. | |
| 6,589,862 B2 | 7/2003 | Wang et al. | |
| 6,596,405 B2 | 7/2003 | Zampini et al. | |
| 6,599,951 B2 | 7/2003 | Zampini et al. | |
| 6,605,362 B2 | 8/2003 | Baldwin et al. | |

(Continued)

FOREIGN PATENT DOCUMENTS

EP 1197511 4/2002

(Continued)

OTHER PUBLICATIONS

Drylie, Ewan et al., Synthesis and Crystal Structures of Bromo- and Ester-Functionalised Polyhedral Silsesquioxanes, Polyhedron, Mar. 6, 2006, vol. 25, pp. 853-858.
Feher, Frank J. et al. A General Strategy for Synthesizing Cubeoctameric Silsesquioxanes Containing Polymerizable Functional Groups. Main Group Chemistry. May 1998, vol. 2, Issue 3, pp. 169-181, ISSN 1024-1221.
J. Am. Chem. Soc. 1991, 113, 4303 by J. F. Cameron and J.M.J. Frechet.
Kennedy et al., An Anthraacene-Organosiloxane Spin on Antireflective Coating for KrF Lithography, Advances in Resist Technology and Processing XX, Theodore H. Fedynshyn, Editor, Proceedings of SPIE vol. 5039, 2003, 144-151.
Kennedy et al., Organosiloxane based Bottom Antireflective Coatings for 193nm Lithography, Advances in Resist Technology and Processing XX, Theodore H. Fedynyshyn, Editor, Proceedings of SPIE vol. 5039, 2003, 929-939.
Polym. Eng. Sci 1992, 32, 1462 by J. V. Crivello.

(Continued)

*Primary Examiner* — Marc Zimmer
(74) *Attorney, Agent, or Firm* — Erika Takeuchi; James L. Cordek; Sharon K. Brady

(57) ABSTRACT

This invention pertains to silsesquioxane resins useful in antireflective coatings wherein the silsesquioxane resin is comprised of the units $(Ph(CH_2)_rSiO_{(3-x)/2}(OR')_x)_m$ $(HSiO_{(3-x)/2}(OR')_x)_n$ $(MeSiO_{(3-x)/2}(OR')_x)_o$ $(RSiO_{(3-x)/2}(OR')_x)_p$ $(R^1SiO_{(3-x)/2}(OR')_x)_q$ where Ph is a phenyl group, Me is a methyl group; R' is hydrogen atom or a hydrocarbon group having from 1 to 4 carbon atoms; R is selected from a hydroxyl producing group; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and m+n+o+p+q≈1.

34 Claims, No Drawings

U.S. PATENT DOCUMENTS

| | | | |
|---|---|---|---|
| 6,730,454 B2 | 5/2004 | Pfeiffer et al. | |
| 6,746,530 B2 | 6/2004 | Wang | |
| 6,824,879 B2 | 11/2004 | Baldwin et al. | |
| 6,924,346 B2 | 8/2005 | Boisvert et al. | |
| 6,956,097 B2 | 10/2005 | Kennedy et al. | |
| 6,969,753 B2 | 11/2005 | Baldwin et al. | |
| 6,982,006 B1 | 1/2006 | Boyers et al. | |
| 7,012,125 B2 | 3/2006 | Kennedy et al. | |
| 7,202,013 B2 | 4/2007 | Ogihara et al. | |
| 7,294,732 B2 | 11/2007 | Ohno et al. | |
| 7,368,173 B2 | 5/2008 | Zhong et al. | |
| 7,393,911 B2 | 7/2008 | Noda | |
| 7,485,690 B2 * | 2/2009 | Hamada et al. | 528/12 |
| 2001/0036998 A1 | 11/2001 | Sakamoto et al. | |
| 2002/0025495 A1 | 2/2002 | Ogata et al. | |
| 2002/0042020 A1 | 4/2002 | Gallagher et al. | |
| 2002/0055000 A1 | 5/2002 | Kennedy et al. | |
| 2002/0065331 A1 | 5/2002 | Zampini et al. | |
| 2002/0095018 A1 | 7/2002 | Baldwin et al. | |
| 2002/0128388 A1 | 9/2002 | Kennedy et al. | |
| 2002/0187422 A1 | 12/2002 | Angelopoulos et al. | |
| 2002/0195419 A1 | 12/2002 | Pavelcheck | |
| 2002/0198269 A1 | 12/2002 | Zampini et al. | |
| 2003/0022953 A1 | 1/2003 | Zampini et al. | |
| 2003/0120018 A1 | 6/2003 | Baldwin et al. | |
| 2003/0199659 A1 | 10/2003 | Baldwin et al. | |
| 2003/0209515 A1 | 11/2003 | Pavelchek | |
| 2005/0245717 A1 | 11/2005 | Kennedy et al. | |
| 2005/0282090 A1 | 12/2005 | Hirayama et al. | |
| 2005/0288468 A1 | 12/2005 | Ohno et al. | |
| 2006/0021964 A1 | 2/2006 | Hirayama et al. | |
| 2006/0089478 A1 | 4/2006 | Noda | |
| 2006/0269724 A1 | 11/2006 | Ohashi et al. | |
| 2007/0022909 A1 | 2/2007 | Kennedy et al. | |
| 2007/0025678 A1 | 2/2007 | Kushibiki et al. | |
| 2007/0298349 A1 | 12/2007 | Zhang et al. | |
| 2008/0014335 A1 | 1/2008 | Fu et al. | |
| 2008/0318436 A1 | 12/2008 | Fu et al. | |
| 2009/0202941 A1 * | 8/2009 | Hu et al. | 430/271.1 |
| 2009/0220889 A1 * | 9/2009 | Sato et al. | 430/286.1 |
| 2009/0280438 A1 * | 11/2009 | Kohno et al. | 430/323 |
| 2009/0312467 A1 * | 12/2009 | Hu et al. | 524/110 |

FOREIGN PATENT DOCUMENTS

| | | |
|---|---|---|
| EP | 1197998 | 4/2002 |
| JP | 06-56560 | 3/1994 |
| JP | 09221630 | 8/1997 |
| JP | 2002338690 | 11/2002 |
| JP | 2002356617 | 12/2002 |
| WO | WO 00/77575 | 12/2000 |
| WO | WO 02/06402 | 1/2002 |
| WO | WO 03/044077 | 5/2003 |
| WO | WO 03/044078 | 5/2003 |
| WO | WO 03/044079 | 5/2003 |
| WO | WO 03/044600 | 5/2003 |
| WO | WO 03/089992 | 10/2003 |
| WO | WO 2004/007192 | 1/2004 |
| WO | WO 2004/044025 | 5/2004 |
| WO | WO 2004/046224 | 6/2004 |
| WO | WO 2004/051376 | 6/2004 |
| WO | WO 2004/090965 | 10/2004 |
| WO | WO 2004/113417 | 12/2004 |
| WO | WO 2005/005235 | 1/2005 |
| WO | WO 2005/034236 | 4/2005 |
| WO | WO 2005/034677 | 4/2005 |
| WO | WO 2005/035236 | 4/2005 |
| WO | WO 2006/019468 | 2/2006 |
| WO | WO 2006/065310 | 6/2006 |
| WO | WO 2006/065316 | 6/2006 |
| WO | WO 2006/065320 | 6/2006 |
| WO | WO 2006/065321 | 6/2006 |
| WO | WO 2007/094848 | 8/2007 |
| WO | WO 2007/094849 | 8/2007 |
| WO | WO 2008/038602 A1 * | 4/2008 |
| WO | WO 2009/088600 | 7/2009 |
| WO | WO 2009/091440 | 7/2009 |
| WO | WO 2009/111122 | 9/2009 |
| WO | WO 2010/068336 | 6/2010 |

OTHER PUBLICATIONS

Rahimian, Kamyar et al., Soluble, High Molecular Weight Polysilsesquioxanes with Carboxylate Functionalities, Macromolecules, Mar. 26, 2002, vol. 35, pp. 2452-2454.

Schiavone et al., SiON based antireflective coating for 193nm lithography, Part of the SPIE Conference on Advances in Resist Technology and Processing XVI, SPIE vol. 3678, Mar. 1999, 391-395.

J. Polym Sci 1999, 37, 4241 by J.V. Crivello.

Xu, Hui et al., Synthesis and Characterization of Oligomeric Silsesquioxane with Pendent Carboxylic Acid Groups, European Polymer Journal, Dec. 2001, vol. 37, pp. 2397-2405.

Tsunooka et al., J. Photopolym. Sci. Technol., vol. 19, No. 1, 2006, pp. 65-71.

Ito et al., Can. J. Chem. 73: 1924-1932 (1995).

King Industries Specialty Chemicals, K-Pure® High Performance Additives for Electronic Chemical Systems.

Emil J. Moriconi et al.: "Reaction of chlorosulfonyl isocyanate with triene systems", The Journal of Organic Chemistry, vol. 41, No. 22, Oct. 1, 1976, pp. 3583-3586.

* cited by examiner

SILSESQUIOXANE RESINS

CROSS REFERENCE TO RELATED APPLICATIONS

This application is a U.S. national stage filing under 35 U.S.C. §371 of PCT Application No. PCT/US09/32906 filed on 03 Feb. 2009, currently pending, which claims the benefit of U.S. Provisional Patent Application No. 61/033,832 filed on 05 Mar. 2008 under 35 U.S.C. §119(e). PCT Application No. PCT/US09/32906 and U.S. Provisional Patent Application No. 61/033,832 are hereby incorporated by reference.

BACKGROUND OF THE INVENTION

With the continuing demand for smaller feature sizes in the semiconductor industry, 193 nm optical lithography has emerged very recently as the technology to produce devices with sub-100 nm features. The use of such a shorter wavelength of light requires the bottom antireflective coating (BARC) to reduce the reflection on substrate and dampen the photoresist swing cure by absorbing light that has passed though the photoresist. Commercially available antireflective coatings consist of both organic and inorganic based materials. Typically, the inorganic ARC, which exhibits good etch resistant, is CVD based and is subject to all the integration disadvantage of extreme topography; on the other hand, the organic ARC materials are applied by spin-on process and have excellent fill and planarization properties, but suffer from poor etch selectivity to organic photoresists. As a result, a material that offers the combined advantages of organic and inorganic ARC is highly desired.

In this regards, we have recently discovered that phenyl-hydride based silsesquioxane resins exhibit excellent anti-reflective coating properties for 193 nm light. This invention pertains to a new silsesquioxane material containing hydroxyl moiety, made via the co-hydrolysis of the corresponding chlorosilanes or alkoxysilanes. The hydroxyl moiety of the silane is protected by an organic group or a silyl group, which cleaves under the acidic conditions to yield the corresponding hydroxyl group. The new hydroxyl functional silsesquioxane resins form excellent spin-on film and has excellent PGMEA and TMAH resistance when cured at 250° C. or below.

BRIEF SUMMARY OF THE INVENTION

This invention pertains to silsesquioxane resins useful in antireflective coatings wherein the silsesquioxane resin is comprised of the units

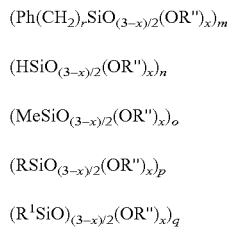

where Ph is a phenyl group, Me is a methyl group; R" is hydrogen atom or a hydrocarbon group having from 1 to 4 carbon atoms; R is selected from a hydroxyl producing group; and $R^1$ is selected from substituted phenyl groups, ester groups, polyether groups; mercapto groups, aryl sulphonic ester groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0 to 0.95; p has a value of 0.05 to 0.5; q has a value of 0 to 0.5; and $m+n+o+p+q\approx1$. When these resins are used in antireflective coatings, they can be cured without any additive at temperatures above 200° C. within 1 minute. The cured films exhibit excellent solvent (i.e. PGMEA) and TMAH resistance. The cured films can be wet-stripped using commercial wet-removal chemicals, such as NE-89 and CCT-1. Finally the anti-reflective coating layer has a water contact angle range from 50°-90° and a surface energy range from (typically 25-45 dynes/cm²).

DETAILED DESCRIPTION OF THE INVENTION

The silsesquioxane resins useful in forming the antireflective coating are comprised of the units

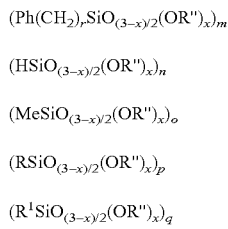

where Ph is a phenyl group, Me is a methyl group; R" is hydrogen atom or a hydrocarbon group having from 1 to 4 carbon atoms; R is selected from a hydroxyl producing group; and $R^1$ is selected from substituted phenyl groups, ester groups, polyether groups; mercapto groups, aryl sulphonic ester groups, carboxylic acid containing groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and $m+n+o+p+q\approx1$ (where m, n, o, p and q are mole fractions). Typically m has a value of 0 to 0.25, alternatively > 0.0 to 0.15. Typically n has a value of 0.15 to 0.40, alternatively 0.10 to 0.3. Typically o has a value of 0.25 to 0.80, alternatively 0.25 to 0.75. Typically p has a value of 0.025 to 0.35, alternatively 0.05 to 0.15. Typically q has a value of 0 to 0.3, alternatively >0 to 0.15.

R" is independently a hydrogen atom or hydrocarbon group having 1 to 4 carbon atoms. R" may be exemplified by H, methyl, ethyl, propyl, iso-propyl and butyl.

In the resin R is a hydroxyl producing group. The hydroxyl producing group is protected by an organic or silyl group that cleaves under acidic conditions to yield the corresponding hydroxyl group. Examples of hydroxyl producing groups are those of the general formula $-R^2OR^3$ where $R^2$ is any organic bridging group bridging between the silicon atom and the $OR^3$ group and $R^3$ is the protecting group. $R^2$ may be further exemplified by hydrocarbon groups having 1 -10 carbon atoms, or any other organic bridging groups known in the art. Protecting groups, $R^3$, are any organic group known in the art that can be cleaved under acidic conditions to form the corresponding hydroxyl (—OH) group. Some of the protecting groups are described in "Protective Groups in Organic Synthesis" by Green and Wuts, $3^{rd}$ Edition, Wiley, N.Y., 1999. p 17-292. Protecting groups may be exemplified by t-butyl, methoxy methyl, tetrhydropyranyl, benzyloxymethyl, cinnamyl, triphenylmethyl, trimethylsilyl, t-butyldimethylsilyl, carbonyl group (as an carboxylic anhydride), and others. $R^3$ may be further exemplified by, but not limited to, t-butyl, trimethylsilyl, and tetrhydropyranyl. R may be exemplified by, but not limited to, $-(CH_2)_3-CO^tBu$, $-(CH_2)_2-CO-SiMe_3$, $-(CH_2)_2-(OCH_2CH_2)_d-CO^tBU$, and $-(CH_2)_3-(OCH_2CH_2)_d-CO-SiMe_3$ where d has a value of 1 to 10.

R[1] is selected from substituted phenyl groups, ester groups, polyether groups; mercapto groups, aryl sulphonic ester groups, and reactive or curable organic functional groups. Substituted phenyl groups contain at least one HO—, MeO—, Me-, Et- Cl— and/or other substituents. Ester groups may be any organic substituent containing at least one ester functionality. Examples of ester groups useful herein are —(CH$_2$)$_2$—O—C(O)Me and —(CH$_2$)$_2$—C(O)—OMe. Polyether groups are an organic substituent having hydrocarbon units linked through oxygen atom, represented, but not limited, by the following structure: —(CH$_2$)$_a$[O(CH$_2$)$_b$]$_c$OR$^4$, wherein a=2 to 12; b=2 to 6; c=2 to 200; R$^4$ is H, alkyl, or other organic groups such as acetyl. Examples of polyether groups useful herein are —(CH$_2$)$_3$—(OCH$_2$CH$_2$)$_c$—OMe, —(CH$_2$)$_3$—(OCH$_2$CH$_2$)$_c$—OH and —(CH$_2$)$_3$—(OCH$_2$CH$_2$)$_7$—OAc and —(CH$_2$)$_3$—(OCH$_2$CH$_2$)$_c$—OC(O)Me. Mercapto groups have the general formula HS(CH$_2$)$_e$— where e has a value of 1-18, such as mercapto propyl, mercapto ethyl, and mercapto methyl. Aryl sulphonic ester groups have the formula R$^5$O—SO$_2$—Ph—(CH$_2$)$_r$— where R$^5$ is a hydrogen atom, an aliphatic group or an aromatic group and r has a value of 0, 1, 2, 3, or 4. Sulphonic ester groups may be exemplified by, but not limited to HO—SO$_2$—Ph—(CH$_2$)r- or (CH$_3$)$_2$CHO—SO$_2$—Ph—(CH$_2$)r-. Reactive or curable organic functional groups may be exemplified by, but not limited to alkenyl groups such at vinyl and allyl; epoxy groups such as glycidoxypropyl group and epoxycyclohexane group, acrylate groups such as methacryoxypropyl groups, acryloxypropyl, and others.

The typical method for producing the silsesquioxane resin involves the hydrolysis and condensation of the appropriate halo or alkoxy silanes. One example is the hydrolysis and condensation of a mixture of phenyltrichlorsilane, trichlorosilane, hydroxyl producing group containing silane, methyltrichlorosilane and optionally other organofunctional trichlorosilanes. By this method it is possible that residual —OH and/or —OR" will remain in the silsesquioxane resin as a result of incomplete hydrolysis or condensation. If the total amount of units in the silsesquioxane resin containing —OR" groups, exceed 40 mole % then gellation and instability of the resin may occur. Typically the silsesquioxane resin contains 6 to 38 mole % of units containing —OR" groups, alternatively less than 5 mole %, alternatively less than 1 mole %.

The silsesquioxane resin has a weight average molecular weight (Mw) in the range of 500 to 200,000 alternatively in the range of 500 to 100,000, alternatively in the range of 700 to 30,0000 as determined by gel permeation chromatography employing RI detection and polystyrene standards.

The typical method for preparing a silsesquioxane resin comprises reacting water, HSiX$_3$, MeSiX$_3$, PhSiX$_3$, RSiX$_3$, and optionally R$^1$SiX$_3$ in an organic solvent, where X is a hydrolyzable group independently selected from Cl, Br, CH$_3$CO$_2$—, an alkoxy group —OR", or other hydrolyzable groups. The silanes useful herein can be exemplified by, but not limited to, HSi(OEt)$_3$, HSiCl$_3$, PhCH$_2$CH$_2$SiCl$_3$, and PhSiCl$_3$, MeSi(OMe)$_3$, MeSiCl$_3$, RSiCl$_3$, RSi(OMe)$_3$, R$^1$SiCl$_3$ and R$^1$Si(OMe)$_3$ where R$^1$ is as defined above, Me represents a methyl group, Et represents an ethyl group and Ph represents a phenyl group.

Hydroxyl producing silanes (RSiX$_3$) that may be used in the preparation of the silsesquioxane resin, may be exemplified by, but not limited to,

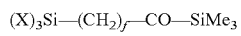

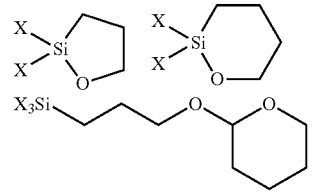

Wherein Me is a methyl group, $^t$Bu is a t-butyl group, X is a chloride or alkoxy group (i.e. OR"), f has a value of 2 or 3 and d has a value of 1 to 10.

The amount of water in the reaction is typically in the range of 0.5 to 2 moles water per mole of X groups in the silane reactants, alternatively 0.5 to 1.5 moles per mole of X groups in the silane reactants.

The time to form the silsesquioxane resin is dependent upon a number of factors such as the temperature, the type and amount of silane reactants, and the amount of catalyst, if present. It is preferred to carry out the reaction for a time sufficient for essentially all of the X groups to undergo hydrolysis reactions. Typically the reaction time is from minutes to hours, alternatively 10 minutes to 1 hour. The reaction to produce the silsesquioxane resin can be carried out at any temperature so long as it does not cause significant gellation or cause curing of the silsesquioxane resin. The temperature at which the reaction is carried out is typically in the range of 25° C. up to the reflux temperature of the reaction mixture. Typically the reaction is carried out by heating under reflux for 10 minutes to 1 hour.

The reaction step comprises both hydrolyzing and condensing the silane components. To facilitate the completion of the reaction a catalyst may be used. The catalyst can be a base or an acid such as a mineral acid. Useful mineral acids include, but are not limited to, HCl, HF, HBr, HNO$_3$, and H$_2$SO$_4$, among others, typically HCl. The benefit of HCl or other volatile acids is that a volatile acid can be easily removed from the composition by stripping after the reaction is completed. The amount of catalyst may depend on its nature. The amount of catalyst is typically 0.05 wt % to 1 wt % based on the total weight of the reaction mixture.

Generally, the silane reactants are either not soluble in water or sparingly soluble in water. In light of this, the reaction is carried out in an organic solvent. The organic solvent is present in any amount sufficient to dissolve the silane reactants. Typically the organic solvent is present from 1 to 99 weight percent, alternatively 70 to about 90 wt % based on the total weight of the reaction mixture. Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol dietheyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilanes routes) and solvents. Methods for removing volatiles are known in the art and include, for example, distillation or stripping under reduced pressure.

Following completion of the reaction the catalyst may be optionally removed. Methods for removing the catalyst are well know in the art and would include neutralization, stripping or water washing or combinations thereof. The catalyst may negatively impact the shelf life of the silsesquioxane resin especially when in solution thus its removal is suggested.

To increase the molecular weight of the silsesquioxane resin and/or to improve the storage stability of the silsesquioxane resin the reaction may be carried out for an extended period of time with heating from 40° C. up to the reflux temperature of the solvent ("bodying step"). The bodying step may be carried out subsequent to the reaction step or as part of the reaction step. Preferably, the bodying step is carried out for a period of time in the range of 10 minutes to 6 hours, more preferably 20 minutes to 3 hours.

Following the reaction to produce the silsesquioxane resin a number of optional steps may be carried out to obtain the silsesquioxane resin in the desired form. For example, the silsesquioxane resin may be recovered in solid form by removing the solvent. The method of solvent removal is not critical and numerous methods are well known in the art (e.g. distillation under heat and/or vacuum). Once the silsesquioxane resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

This invention also pertains to an antireflective coating (ARC) composition comprising
(i) silsesquioxane resin comprised of the units

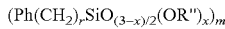

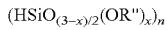

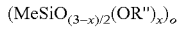

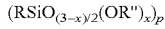

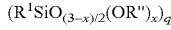

$(Ph(CH_2)_rSiO_{(3-x)/2}(OR'')_x)_m$ $(HSiO_{(3-x)/2}(OR'')_x)_n$ $(MeSiO_{(3-x)/2}(OR'')_x)_o$ $(RSiO_{(3-x)/2}(OR'')_x)_p$ $(R^1SiO_{(3-x)/2}(OR'')_x)_q$ where Ph is a phenyl group, Me is a methyl group; R" is hydrogen atom or a hydrocarbon group having from 1 to 4 carbon atoms; R is selected from an a hydroxyl producing group; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and $m+n+o+p+q\approx1$.; and
(ii) a solvent.

Useful solvents (ii) include, but are not limited to, 1-methoxy-2-propanol, propylene glycol monomethyl ethyl acetate (PGMEA), gamma-butyrolactone, and cyclohexanone, among others. The ARC composition typically comprises from about 10% to about 99.9 wt % solvent based on the total weight of the ARC composition, alternatively 80 to 95 wt %.

The ARC composition may comprise a free radical initiator which can be generated thermally or photochemically, or other additives. Suitable free radical initiators include peroxides such as benzoyl peroxide, dicumyl peroxide, azobisisobutyronitrile (AIBN) and others. Typically the free radical initiator is present in an amount of up to 1000 ppm, alternatively 10 to 500 ppm, based on the total weight of the ARC composition. The other additives may include, but not limited to, photo-acid and thermal-acid generators, photo-base and thermal-base generators.

The antireflective coating compositions are formed by mixing together the silsesquioxane resin, solvent, and optionally the free radical initiator or other additive. Typically the free radical initiator or other additive is added to the coating composition just prior to its use to prevent premature curing.

This invention also pertains to a method of forming an antireflective coating on an electronic device comprising
(A) applying to an electronic device an ARC composition comprising
(i) silsesquioxane resin comprised of the units

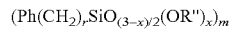

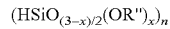

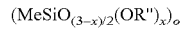

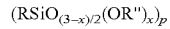

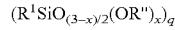

$(Ph(CH_2)_rSiO_{(3-x)/2}(OR'')_x)_m$ $(HSiO_{(3-x)/2}(OR'')_x)_n$ $(MeSiO_{(3-x)/2}(OR'')_x)_o$ $(RSiO_{(3-x)/2}(OR'')_x)_p$ $(R^1SiO_{(3-x)/2}(OR'')_x)_q$ where Ph is a phenyl group, Me is a methyl group; R" is hydrogen atom or a hydrocarbon group having from 1 to 4 carbon atoms; R is selected from a hydroxyl producing group; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and $m+n+o+p+q\approx1$.; and
(ii) a solvent, and
(B) removing the solvent and curing the silsesquioxane resin to form an antireflective coating on the electronic device.

The antireflective coating composition is applied to an electronic device to produce a coated substrate. The solvent is removed and the silsesquioxane resin is cured to produce the antireflective coating on the electronic device.

Typically the electronic device is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

Specific methods for application of the ARC composition to the electronic device include, but are not limited to, spin-coating, dip-coating, spay-coating, flow-coating, screen-printing and others. The preferred method for application is spin coating. Typically, coating involves spinning the electronic device, at about 2000 RPM, and adding the ARC composition to the surface of the spinning electronic device.

The solvent is removed and the silsesquioxane resin is cured to form the anti-reflective coating on the electronic device. Curing generally comprises heating the coating to a sufficient temperature for a sufficient duration to lead to curing. Curing occurs when sufficient crosslinking has taken place such that the silsesquioxane resin is essentially insoluble in the solvent from which it was applied. Curing may take place for example by heating the coated electronic device at 80° C. to 450° C. for 0.1 to 60 minutes, alternatively 150° C. to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates. Alternatively, the anti-reflective coating can be cured under ultraviolet irradiation in the presence of photoactive additives, such as photoacid generator (PAG) or photobase generators.

To protect the silsesquioxane resin of the coated composition from reactions with oxygen or carbon during curing, the curing step can be performed under an inert atmosphere. Inert atmospheres useful herein include, but are not limited to nitrogen and argon. By "inert" it is meant that the environment contain less than 50 ppm and preferably less than 10 ppm of oxygen. The pressure at which the curing and removal steps are carried out is not critical. The curing step is typically carried out at atmospheric pressure although sub or super atmospheric pressures may work also.

The coatings produced from the silsesquioxane resins typically have a thickness of 1000 Å to 5000 Å, alternatively 1500 Å to 3000 Å. Additionally, the films typically have a water contact angle of 50° to 90° and a surface energy of 25 to 45 dynes/cm$^2$.

Once cured, the electronic device comprising the anti-reflective coating can be used in further substrate processing steps, such as photolithography. When used in photolithography, a resist image is formed over the anti-reflective coating. The process for forming the resist image comprises (a) forming a film of a resist composition on top of the anti-reflective coating; (b) imagewise exposing the resist film to radiation to produce an exposed film; and (c) developing the exposed film to produce an image. The anti-reflective coatings on the electronic device are particularly useful with resist compositions that are imagewise exposed to ultraviolet radiation having a wavelength of 157 nm to 365 nm, alternatively ultraviolet radiation having a wavelength of 157 nm or 193 nm. Once an image has been produced in the resist film, then a pattern is etched in the anti-reflective coating. Known etching materials may be used to remove the anti-reflective coating. Additional steps or removing the resist film and remaining anti-reflective coating may be employed to produce a device having the desired architecture.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. % unless otherwise stated and PDI is the polydispersity index.

The film coating on wafers was processed on a Karl Suss CT62 spin coater. The resin PGMEA solution was first filtered through a 0.2 micron TEFLON filter and then spin coated onto standard single side four inch polished low resistively wafers or double sided polished FTIR wafers (spin speed=2000 rpm; acceleration speed=5000, time=20 seconds unless otherwise indicated). Films were cured at a temperature (200-250° C.) for 60 seconds using a rapid thermal processing (RTP) oven with a nitrogen gas purge. The film thickness, refractive index and k value were determined using a J. A. Woollam ellipsometer. The thickness values recorded were the average of nine measurements. PGMEA resistance after cure was determined by measuring the film thickness change before and after PGMEA rinse. The wet removal rate was assessed with two commercial wet stripping solutions NE89 and CC1. Contact angle measurements were conducted using water and methylene iodide as liquids and the critical surface tension of wetting was calculated based on the Zisman approach.

Example 1

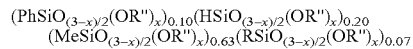

In a reactor at 20° C. were loaded with PGMEA (430 g) and DI-water (20 g). The water is quickly dispersed in PGMEA by stirring into a homogenous solution. To a separate feeding flask was then added propylene glycol methyl ether acetate (PGMEA, 240 g), phenyltrichlorosilane (10.6 g, 0.05 mole), methyltrichlorosilane (47.1 g, 0.315 mol), trichlorosilane (13.6 g, 0.1 mole), and 2-(1-trimethoxysilyl propyloxy) tetrahydropyran (9.70 g, 0.035 mol). Next, the solution in the feeding flask was added to the reactor under nitrogen over 1 hr 10 min using a peristaltic pump. After the completion of addition, the mixture in the reactor was washed twice by adding DI water twice (2×1000 g). The solution was then stripped after adding EtOH (40 g) using rotor-yap to give a clear PGMEA solution. The solution is diluted to 10 Wt. % by adding more PGMEA and then filtrated through a 0.2 mm Teflon filter. GPC data (vs. polystyrene): Mw=29100, PDI=4.08.

A film coating was produced as described above and measured for various properties as described above. Film thickness=2269 Å. Film loss after cure at 215° C. for 1 min.: 19 Å for PGMEA loss, and 4 Å for TMAH loss. Wet removal rate in 1 min.: 100% by NE-89.

Example 2

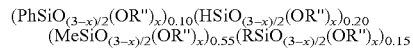

To a reactor at 20° C. loaded with PGMEA and DI-water was added propylene glycol methyl ether acetate (PGMEA, 400 g), phenyltrichlorosilane (10.6 g, 0.05 mole), methyltrichlorosilane (41.1 g, 0.275 mol), trichlorosilane (13.6 g, 0.1 mole), and 2-(1-trimethoxysilyl propyloxy) tetrahydropyran (20.8 g, 0.075 mol). After the completion of addition, the mixture in the reactor was washed twice by adding DI water twice. The solution was then stripped using rotor-vap to give a clear PGMEA solution. The solution is diluted to 10 Wt. % by adding more PGMEA and then filtrated through a 0.2 mm Teflon filter. GPC data (vs. polystyrene): Mw=42000, PDI=7.93.

A film coating was produced as described above and measured for various properties as described above. Film thickness=2237 Å. Film loss after cure at 215° C. for 1 min.: 12 Å for PGMEA loss, and 8 Å for TMAH loss. Wet removal rate in 1 min.: 100% by NE-89.

Example 3

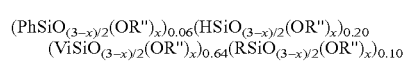

To a reactor at 20° C. loaded with PGMEA and DI-water was added propylene glycol methyl ether acetate (PGMEA), phenyltrichlorosilane (6.35 g), vinyltrichlorosilane (51.68 g), trichlorosilane (13.6 g), and 2-(1-trimethoxysilyl propyloxy) tetrahydropyran (13.9 g). After the completion of addition, the mixture in the reactor was washed twice by adding DI water twice. The solution was then stripped using rotor-vap to give a clear PGMEA solution. The solution is diluted to 10 Wt. % by adding more PGMEA and then filtrated through a 0.2 mm Teflon filter. GPC data (vs. polystyrene): Mw=11800, PDI=3.09.

A film coating was produced as described above and measured for various properties as described above. Film thickness=1913 Å. Film loss after cure at 215° C. for 1 min.: 22 Å for PGMEA loss, and 8 Å for TMAH loss. Wet removal rate in 1 min.: 100% by NE-89.

Example 4

$(HOPhSiO_{(3-x)/2}(OR'')_x)_{0.10}(HSiO_{(3-x)/2}(OR'')_x)_{0.30}$
$(MeSiO_{(3-x)/2}(OR'')_x)_{0.50}(RSiO_{(3-x)/2}(OR'')_x)_{0.10}$

To a reactor at 20° C. loaded with PGMEA and DI-water was added propylene glycol methyl ether acetate (PGMEA), [3-(o-methylcarbonate-phenyl)propyl]trimethoxysilane (12.80 g), methyltrichlorosilane (37.37 g), trichlorosilane (20.32 g), and 2-(1-trimethoxysilyl propyloxy) tetrahydropyran (13.9 g). After the completion of addition, the mixture in the reactor was washed twice by adding DI water twice. The solution was then stripped using rotor-vap to give a clear PGMEA solution. The solution is diluted to 10 Wt. % by adding more PGMEA and then filtrated through a 0.2 mm Teflon filter. GPC data (vs. polystyrene): Mw=14600, PDI=3.98.

A film coating was produced as described above and measured for various properties as described above. Film thickness=2098 Å. Film loss after cure at 215° C. for 1 min.: 88 Å for PGMEA loss, and 102 Å for TMAH loss. Wet removal rate in 1 min.: 100% by NE-89.

We claim:

1. A silsesquioxane resin wherein comprising the units $(Ph(CH_2)_rSiO_{(3-x)/2}(OR'')_x)_m$ $(HSiO_{(3-x)/2}(OR'')_x)_n$ $(MeSiO_{(3-x)/2}(OR'')_x)_o$ $(RSiO_{(3-x)/2}(OR'')_x)_p$ $(R^1SiO_{(3-x)/2}(OR'')_x)_q$ where Ph is a phenyl group, Me is a methyl group; R" is hydrogen atom or a hydrocarbon group having from 1 to 4 carbon atoms; R is selected from a hydroxyl producing group; and $R^1$ is selected from substituted phenyl groups, ester groups, polyether groups; mercapto groups, aryl sulphonic ester groups, carboxylic acid containing groups, and reactive or curable organic functional groups; and r has a value of 0, 1, 2, 3, or 4; x has a value of 0, 1 or 2; wherein in the resin m has a value of greater than 0 to 0.95; n has a value of 0.05 to 0.95; o has a value of greater than 0.05 to 0.95; p has a value of 0.05 to 0.5; q has a value of greater than 0 to 0.5; and m+n+o+p+q≈1.

2. The resin as claimed in claim 1 wherein m has a value of greater than 0 to 0.25, n has a value of 0.15 to 0.40, o has a value of 0.25 to 0.80, p has a value of 0.025 to 0.35 and q has a value of greater than 0 to 0.3.

3. The resin as claimed in claim 1 wherein m has a value of >0 to 0.15, n has a value of 0.10 to 0.3, o has a value of 0.25 to 0.75, p has a value of 0.05 to 0.15 and q has a value of >0 to 0.15.

4. The resin as claimed in claim 1 wherein the hydroxyl producing group, R, has the formula

—$R^2OR^3$ where $R^2$ is any organic bridging group and $R^3$ is a protecting group.

5. The resin as claimed in claim 4 wherein the hydroxyl producing group has the formula $R^2$—O—$SiMe_3$ or $R^2$—O—$^tBu$.

6. The resin as claimed in claim 1 wherein $R^1$ is an alkenyl group.

7. The resin as claimed in claim 1 wherein the resin contains 6 to 38 mole % of units having —OR" groups.

8. The resin as claimed in claim 1 wherein the resin has an average molecular weight (Mw) of 700 to 30,000.

9. An antireflective coating composition comprising
(i) silsesquioxane resin comprising the units $(Ph(CH_2)_rSiO_{(3-x)/2}(OR'')_x)_m$ $(HSiO_{(3-x)/2}(OR'')_x)_n$ $(MeSiO_{(3-x)/2}(OR'')_x)_o$ $(RSiO_{(3-x)/2}(OR'')_x)_p$ $(R^1SiO_{(3-x)/2}(OR'')_x)_q$ where Ph is a phenyl group, Me is a methyl group; R" is hydrogen atom or a hydrocarbon group having from 1 to 4 carbon atoms; R is selected from an a hydroxyl producing group; and $R^1$ is selected from substituted phenyl groups, ester groups, polyether groups; mercapto groups, aryl sulphonic ester groups, and reactive or curable organic functional groups; and r has a value of 0, 1, 2, 3, or 4; x has a value of 0, 1 or 2; wherein in the resin m has a value of greater than 0 to 0.95; n has a value of 0.05 to 0.95; o has a value of 0.05 to 0.95; p has a value of 0.05 to 0.5; q has a value of greater than 0 to 0.5; and m+n+o+p+q≈1.; and (ii) a solvent.

10. The antireflective coating composition as claimed in claim 9 wherein m has a value of greater than 0 to 0.25, n has a value of 0.15 to 0.40, o has a value of 0.25 to 0.80, p has a value of 0.025 to 0.35 and q has a value of greater than 0 to 0.3.

11. The antireflective coating composition as claimed in claim 9 wherein m has a value of >0 to 0.15, n has a value of 0.10 to 0.3, o has a value of 0.25 to 0.75, p has a value of 0.05 to 0.15 and q has a value of >0 to 0.15.

12. The antireflective coating composition as claimed in claim 9 wherein the hydroxyl producing group has the formula —$R^2OR^3$ where $R^2$ is any organic bridging group and $R^3$ is a protecting group.

13. The antireflective coating composition as claimed in claim 12 wherein the hydroxyl producing group has the formula $R^2$—O—$SiMe_3$ or $R^2$—O—$^tBu$.

14. The antireflective coating composition as claimed in claim 9 wherein $R^1$ is an alkenyl group.

15. The antireflective coating composition as claimed in claim 9 wherein the resin contains 6 to 38 mole % of units having —OR" groups.

16. The antireflective coating composition as claimed in claim 9 wherein the resin has an average molecular weight (Mw) of 700 to 30,000.

17. The antireflective coating composition as claimed in claim 9 wherein the solvent is selected from 1-methoxy-2-propanol, propylene glycol monomethyl ethyl acetate (PGMEA), gamma-butyrolactone, and cyclohexanone.

18. The antireflective coating composition as claimed in claim 9 wherein the composition comprises 80 to 95 wt % solvent based on the total weight of the composition.

19. The antireflective coating composition as claimed in claim 9 wherein the composition additionally comprises a free radical initiator.

20. A method of forming an antireflective coating on an electronic device comprising
   (A) applying to an electronic device an anti-reflective coating composition comprising
      (i) silsesquioxane resin comprising the units $(Ph(CH_2)_rSiO_{(3-x)/2}(OR")_x)_m$ $(HSiO_{(3-x)/2}(OR")_x)_n$ $(MeSiO_{(3-x)/2}(OR")_x)_o$ $(RSiO_{(3-x)/2}(OR")_x)_p$ $(R^1SiO_{(3-x)/2}(OR")_x)_q$ where Ph is a phenyl group, Me is a methyl group; R" is hydrogen atom or a hydrocarbon group having from 1 to 4 carbon atoms; R is selected from a hydroxyl producing group; and $R^1$ is selected from substituted phenyl groups, ester groups, polyether groups; mercapto groups, aryl sulphonic ester groups, and reactive or curable organic functional groups; and r has a value of 0, 1, 2, 3, or 4; x has a value of 0, 1 or 2; wherein in the resin m has a value of greater than 0 to 0.95; n has a value of 0.05 to 0.95; o has a value of 0.05 to 0.95; p has a value of 0.05 to 0.5; q has a value of greater than 0 to 0.5; and m+n+o+p+q≈1.; and
      (ii) a solvent, and
   (B) removing the solvent and curing the silsesquioxane resin to form an antireflective coating on the electronic device.

21. The method as claimed in claim 20 wherein m has a value of greater than 0 to 0.25, n has a value of 0.15 to 0.40, o has a value of 0.25 to 0.80, p has a value of 0.025 to 0.35 and q has a value of greater than 0 to 0.3.

22. The method as claimed in claim 20 wherein m has a value of >0 to 0.15, n has a value of 0.10 to 0.3, o has a value of 0.25 to 0.75, p has a value of 0.05 to 0.15 and q has a value of >0 to 0.15.

23. The method as claimed in claim 20 wherein the hydroxyl producing group has the formula —$R^2OR^3$ where $R^2$ is any organic bridging group and $R^3$ is a protecting group.

24. The method as claimed in claim 23 wherein the hydroxyl producing group has the formula $R^2$—O—$SiMe_3$ or $R^2$—O—$^tBu$.

25. The method as claimed in claim 20 wherein $R^1$ is an alkenyl group.

26. The method as claimed in claim 20 wherein the resin contains 6 to 38 mole % of units having —OR" groups.

27. The method as claimed in claim 20 wherein the resin has an average molecular weight (Mw) of 700 to 30,000.

28. The method as claimed in claim 20 wherein the solvent is selected from 1-methoxy-2-propanol, propylene glycol monomethyl ethyl acetate (PGMEA), gamma-butyrolactone, and cyclohexanone.

29. The method as claimed in claim 20 wherein the composition comprises 80 to 95 wt % solvent based on the total weight of the composition.

30. The method as claimed in claim 20 wherein the composition additionally comprises a free radical initiator.

31. The method as claimed in claim 20 wherein the antireflective coating composition is applied by spin-coating, dip-coating, spray-coating, flow-coating, or screen printing.

32. The method as claimed in claim 31 wherein the antireflective coating composition is applied by spin-coating.

33. The method as claimed in claim 20 wherein removing the solvent and curing comprises heating the coated substrate to 80° C. to 450° C. for 0.1 to 60 minutes.

34. The method as claimed in claim 20 wherein the curing takes place in an inert atmosphere.

* * * * *